United States Patent [19]

Becker

[11] Patent Number: 4,868,493

[45] Date of Patent: Sep. 19, 1989

[54] DEVICE FOR THE FUNCTIONAL TESTING OF INTEGRATED CIRCUITS AND A METHOD FOR OPERATING THE DEVICE

[75] Inventor: Reinhold Becker, Nuremberg, Fed. Rep. of Germany

[73] Assignee: Siemens Aktiengesellschaft, Munich, Fed. Rep. of Germany

[21] Appl. No.: 250,999

[22] Filed: Sep. 27, 1988

Related U.S. Application Data

[63] Continuation of Ser. No. 777,604, Sep. 19, 1985.

[30] Foreign Application Priority Data

Sep. 21, 1984 [DE] Fed. Rep. of Germany ....... 3434749

[51] Int. Cl.[4] .................. G01R 1/04; G01R 1/073
[52] U.S. Cl. .................. 324/73 R; 324/158 P; 324/158 F
[58] Field of Search ............. 324/73 R, 73 PC, 158 P, 324/158 F; 357/81, 82; 361/383, 384, 400

[56] References Cited

U.S. PATENT DOCUMENTS

| | | | |
|---|---|---|---|
| 3,512,582 | 5/1970 | Chu et al. | 357/82 |
| 3,649,738 | 3/1972 | Andersson et al. | 357/82 |
| 3,842,346 | 10/1974 | Bobbitt | 324/73 R |
| 3,909,934 | 10/1975 | Epple | 29/628 |
| 4,045,735 | 8/1977 | Worcester et al. | 324/158 F |
| 4,125,763 | 11/1978 | Drabing et al. | 324/73 R |
| 4,354,268 | 10/1982 | Michel et al. | 324/73 R |
| 4,393,437 | 7/1983 | Bell et al. | 361/384 |
| 4,402,055 | 8/1983 | Lloyd et al. | 371/20 |
| 4,411,719 | 10/1983 | Lindberg | 156/64 |
| 4,497,056 | 1/1985 | Sugamori | 371/20 |

FOREIGN PATENT DOCUMENTS

| | | | |
|---|---|---|---|
| 3143768 | 5/1983 | Fed. Rep. of Germany. | |
| 2104669 | 3/1983 | United Kingdom | 324/158 F |
| 8304315 | 12/1983 | World Int. Prop. O. | 324/73 R |

OTHER PUBLICATIONS

"Mass Termination Test Probe Fixture", by Reib et al., IBM Tech. Disc. Bull., vol. 21 #2, 7/78, pp. 765–766.
"Module Thermal Test Chamber", by Kilburn et al., IBM Tech. Disc. Bull., vol. 24, #9, 282, pp. 4650–4651.
Fairchild Product Description, "Series 10 Production LSI Test System", Fairchild Corporation, May 1981, No. 57148901.

Primary Examiner—Reinhard J. Eisenzopf
Assistant Examiner—W. Burns
Attorney, Agent, or Firm—Kenyon & Kenyon

[57] ABSTRACT

The invention relates to a device for the functional testing of integrated circuits, in which the integrated circuit to be tested can be connected via adapters to computer-controlled test heads. In order to make the testing device more flexible and increase its efficiency, a test piece (i.e., integrated circuit) with a large number of external terminals can be connected via a special adapter to at least two test heads placed side by side and can be tested by them in common and/or two or more test pieces with a smaller number of terminals can be connected via a second special adapter to a single test head and be tested in common. The invention further relates to associated operating methods.

10 Claims, 3 Drawing Sheets

DEVICE FOR THE FUNCTIONAL TESTING OF INTEGRATED CIRCUITS AND A METHOD FOR OPERATING THE DEVICE

This is a continuation of application Ser. No. 777,604 filed Sept. 19, 1985.

TECHNICAL FIELD

The invention relates to a device for the functional testing of integrated circuits, and other electronic test pieces, with a multiplicity of external terminals. The invention further relates to corresponding operating methods.

BACKGROUND OF THE INVENTION

Devices which functionally test integrated circuits having a large number of external terminals are already well known, such as, the LSI TEST SYSTEM described in the company bulletin, Fairchild Product Description, May 1981, No. 57148901. With respect to integrated circuits, the requirement exists on the part of the manufacturer, as well as on the user level, to identify defective products by systematic functional tests. For one, the manufacturer must ensure a high quality standard of its shipments for reasons of competitiveness and, secondly, it needs feedback data for its internal production process. The user, on the other hand, wants to pay only for perfect goods, wants to be able to judge the reliability of different suppliers and wants to avoid trouble in his own production as a result of defective parts received.

The achieved and further increasing complexity of integrated circuits (more and more functions are now being combined on a single semiconductor chip) requires, for technical and economic reasons, the automation of the testing process. The primary tool to automate the testing process is the use of electronic computers which control the running of testing programs for the integrated circuit test piece, for instance, in the case of digitally operating test pieces, defined sequences of bit patterns. With respect to the automation of the mechanical aspect of the testing process, the manual feeding of a test piece to a test station can be replaced by feeding devices and automatic handling devices.

A further practical problem goes hand in hand with the complexity of the integrated circuits: the large number of external terminals (pins) which are required for access to the highly integrated functions raises difficulties with arrangement and contacting with testing devices. A particular design problem arising therefrom, especially in a testing device for integrated circuits, is that the device which must be designed with largest dimensions on the one hand to accommodate the test pieces with the maximum amount of terminals which can be tested causes, on the other hand, the device to operate uneconomically when test pieces with a relatively small number of external terminals are tested. This problem cannot be remedied by having available a multiplicity of test heads designed in graduated stages at the testing station since a plurality of these expensive system components would be idle for most uses.

It is therefore an object of the invention to make a device of the type mentioned at the outset so flexible and economical that test pieces with the most different number of terminals can be tested, utilizing the existing testing capacity, namely, the number of test piece terminals that can be accomodated by the test heads, to the fullest.

SUMMARY OF THE INVENTION

The foregoing problem is solved by the present invention which is a testing device comprising: (a) a plurality of test heads, at least two of which are in mutual physical proximity and can be coupled to a main computer, each head having a terminal field comprising electrically conducting contacts to which a test piece can be connected and through which electrical signals can be applied and tested at the test piece terminals connected thereto; (b) a first adapter for connecting a test head to a test piece having, at most, a maximum number of terminals that can be accommodated by the particular test head; and (c) a second adapter for connecting part of the test piece terminals of a test piece, having a number of terminals which exceed the maximum number of terminals that can be accommodated by a first test head of the at least two proximate test heads, to the first test head and the rest of the test piece terminals to at least one further test head in mutual physical proximity, the testing of the at least two test heads coordinated in a common test program of the main computer.

The advantage of the present invention is the flexibility of the testing device with regard to testing test pieces with the most different number of terminals and the economic usability of the testing capacity of the test heads connected therewith. Another, intrinsic advantage is that the invention (if the testing capacity is given) is capable of setting up several physically separated test stations if required. Particularly efficient test devices are obtained by a selectable application of the solution principles.

An embodiment of the test heads of the testing device in which the terminal fields are arranged off-center has the advantage that the respective fields will be as close together as possible if the test heads stand side by side, so that, the corresponding adapter has smaller dimensions and the connecting path between the test piece and the test heads becomes a minimum, which represents a necessary requirement for high testing-cycle frequencies.

In order to avoid thermal short-circuits of test heads mounted side by side, the invention further conceives of directing cooling air streams in an orientation which provides proper ventilation and removes excess heat from the test heads during operation.

The invention can also be arranged to provide an advantagous connecting and disconnecting capability between the test piece or test pieces and the adapter on the one hand and between the adapters and the test head or test heads on the other hand.

The invention also is directed to testing methods which set up advantagous testing-cycle organizations, for example, the test pieces need not be fed to the test station simultaneously but a test piece can be tested even if the next test piece is not yet placed or not placed completely in the adapter.

BRIEF DESCRIPTION OF THE DRAWINGS

The invention is explained in greater detail by means of the embodiment examples shown in the following drawings.

DETAILED DESCRIPTION

Figure 1:
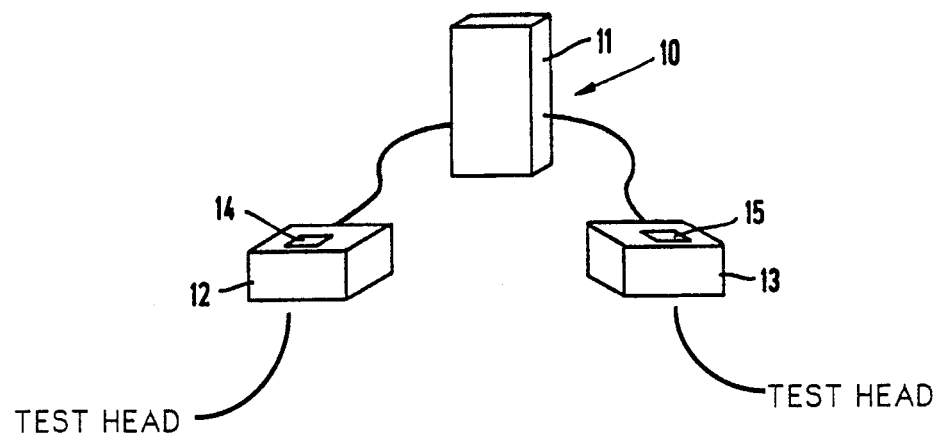
FIG. 1 is a schematic representation of a testing device with two test heads coupled to a main computer.

A testing device 10, depicted in FIG. 1, comprises a main computer 11 and a plurality of test heads (only two test heads 12, 13 shown) coupled thereto. The main computer 11 stores testing programs, sends them to the test heads 12, 13, monitors the test runs, prepares test reports and statistics, controls possible feeding devices, etc. The test heads 12, 13 are, preferably, identical for economic reasons but may have different configurations if required. The test heads 12, 13 have on their respective top sides an off-center terminal field 14 and an off-center terminal field 15.

Figure 2:
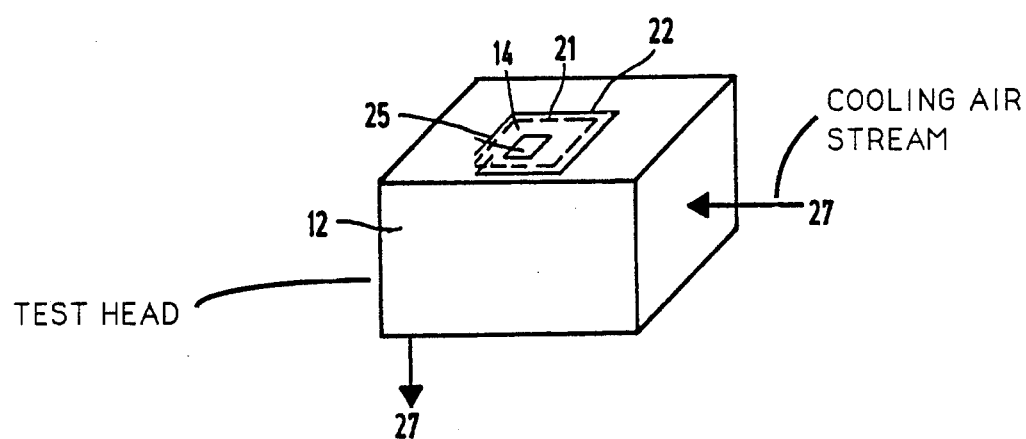
FIG. 2 is a schematic representation of one test head of FIG. 1 in individual operation.

FIG. 2 shows one test head 12 of the testing device 10 which exemplifies the structure and operation of a test head utilized by the invention. The terminal field 14 comprises resilient contact pins 21 arranged in an, for example, 8 × 8 raster or line pattern. The contact pins 21 establish the electrical connection to an adapter 22 atop the pins 21 which carries a test piece 25 in a plug-in socket formed thereon (not shown). In the interior of the test head 12, there is peripheral hardware, i.e., pin electronics (not shown), for addressing the terminals of the test piece 25 and providing signal paths as short as possible between the addressing electronics of the test head 12 and the test piece 25 terminals which are necessary for fast testing operations, i.e., for high test clock frequencies. At the same time, the signal paths to the individual test piece 25 terminals should be, if possible, of equal length so that no propagation time differences (i.e., skew), with resulting irregular test results, occur when test signals are applied. Note, also, that FIG. 2 shows a supply of blown cooled air 27 which may be required to remove excess heat from the test head 12 during operation.

Figure 3:
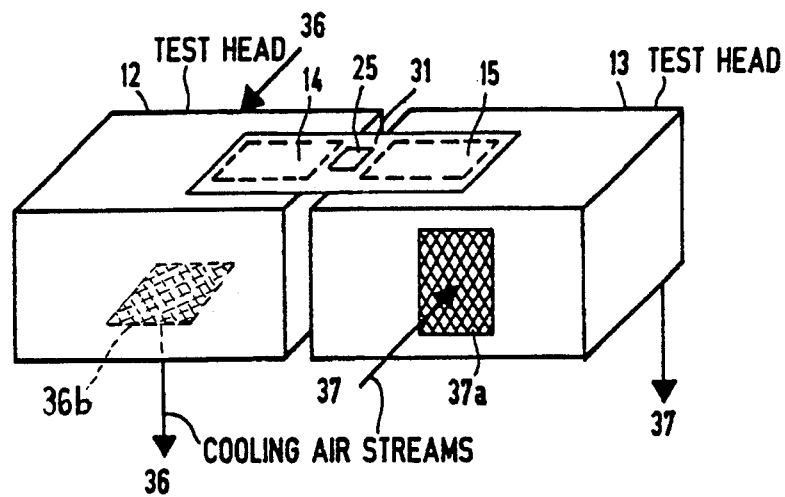
FIG. 3 is a schematic representation of two test heads of FIG. 1 in tandem configuration testing a test piece with many terminals.
Figure 4:
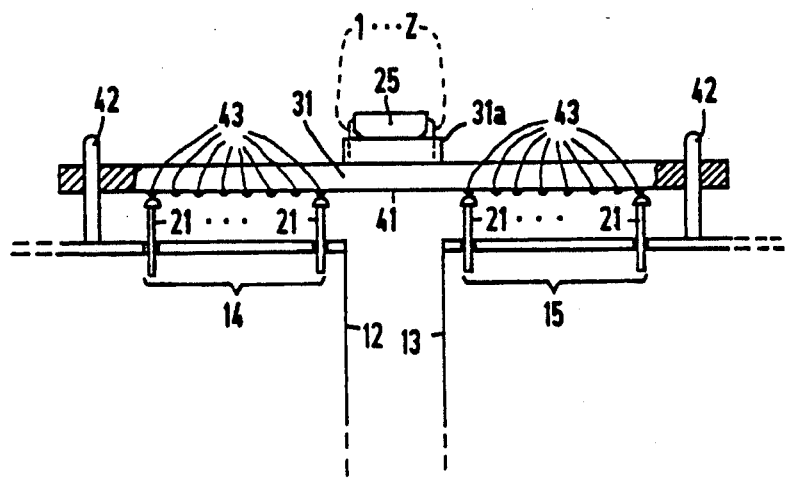
FIG. 4 is a cross-sectional view of the tandem configuration of FIG. 3.

In fast testing devices, the pin electronics has considerable volume, for instance, a data processor plus data and program storage per test piece 25 terminal. Consequently, for reasons of economy, there arises a requirement for maximum utilization of the testing capacity, i.e., of the test piece 25 terminals that can be accomodated by a single test head. At the same time, however, there is the desire to be able to test test pieces 25 with the most different numbers of terminals in an existing test device 10 as possible. These contradictory requirements are met by the invention which provides a flexible testing device having a plurality of test heads in a tandem configuration. Two test heads 12, 13 in a tandem configuration are illustrated in FIGS. 3 and 4. The two test heads 12, 13 each have medium testing capacity (according to present-day standards, each can accommodate, for instance, a 64 terminal test piece 25) and, if required, cooperate in testing a test piece 25 with more pins (up to 128 external terminals in the example mentioned). The off-center arrangement of the terminal fields 14, 15 is of great advantage because the test heads 12, 13 can then be placed side by side with the terminal fields 14, 15 facing each other on their sides resulting in short connecting paths to the test piece 25. The test piece 25 is placed in a plug-in socket 31a of a special tandem adapter 31, the plate 41 of which covers both terminal fields 14, 15 of the test heads 12, 13 placed side by side. The adapter 31 is fixed to the test heads 12, 13 via centering pins 42 and is electrically connected, via a plurality of terminal contacts 43 arranged in the same raster or line pattern, to the pins 21 of the terminal fields 14, 15 of both test heads 12, 13.

The main computer 11 sets into the test heads 12, 13 those testing program parts which together produce the one testing program for the test piece 25 having a large number of terminals. During operation, one test head takes over the control of the test cycle and synchronizes the other test head.

As noted previously, the voluminous electronics from the test heads 12, 13 may require a supply of cooling air by blowers. In a tandem placement of the test heads 12, 13 according to FIGS. 3 and 4, a thermal short-circuit is precluded by ventilating the test heads 12, 13 similarly to the air stream 27 shown in FIG. 2. A first cooling air stream 36 and a second cooling air stream 37 are each conducted into a respective test head 12, 13 via a respective first opening or aid grid 36a, 37a (only air grid 37a shown in FIG. 3) at one of the lateral surfaces of each test head housing which face away from the associated other test head and conducted out again through the bottom surface of the respective test head housing via a respective second opening or air grid 36b, 37b (only air grid 36b shown in FIG. 3). The orientation of each of the cooling air streams 36, 37 is of secondary importance here; the only requirement is that each orientation be the same for both test heads 12, 13 because, otherwise, one test head sucks in the exhaust air of the other test head. In any event, it is evident that test heads which are of identical design can be used in an advantageous manner with respect to their cooling system.

Figure 5:
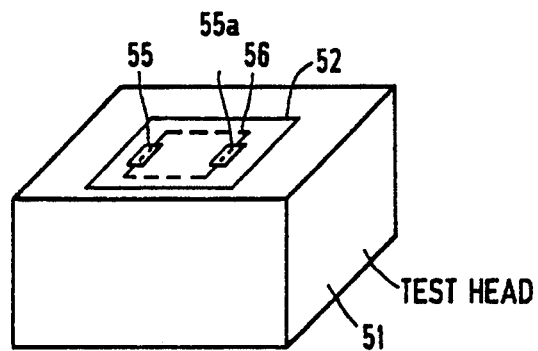
FIG. 5 is a schematic representation of one test head of FIG. 1 testing two test pieces with comparatively few terminals.

Alternatively, a flexible testing device is also obtained by an arrangement shown in FIG. 5 comprising a main computer (not shown) and at least one test head 51 of relatively high testing capacity (for instance, a 128 terminal test piece can be accommodated) having at least two test pieces 55, 55a connected to a terminal field 56 of the test head 51 for testing.

A special multiple piece adapter 53 is connected in a manner analogous to the special tandem adapter 31 described in FIGS. 3 and 4, with the difference that the multiple piece adapter 53 has two plug-in sockets (not shown) for the two test pieces 55, 55a (i.e., one socket per test piece if more than two test pieces are tested). After the test pieces 55, 55a are placed in the plug-in sockets of the special multiple piece adapter 53, the functional test for both (i.e., all) test pieces 55, 55a proceeds. If the test pieces 55, 55a are equal, this is done advantageously under a common test program; if the test pieces 55, 55a are different, the testing program is split into two independent parallel test procedures (i.e., one procedure per test piece if more than two test pieces are tested).

If the test head 51 has available addressing hardware for individual terminals (pin electronics) so that groups of test head terminals can be organized independently of each other for test runs, the test pieces 55, 55a can then also be fed into plug-in sockets of the multiple piece adapter 53 and tested independently of each other in time. This organization method, for instance, can thus bring about an alternating rhythm of loading the plug-in sockets of the multiple piece adapter 53 which, in some circumstances, may be merely advantageous but, in others, may be operationally necessary. If only one loading device is provided at the test station, one plug-in socket of the adapter 53 can be cleaned out and occupied by a test piece while another test piece is being tested.

Finally, testing device arrangements which combine the use of the two aforedescribed flexibility concepts (shown in FIGS. 3, 4, and 5) in each other are especially flexible and economically loadable. For example, for a testing device with two test heads of medium testing capacity, test pieces with a large number of terminals can be tested while test pieces with a small number of terminals can ultilize the existing testing capacity for a substantial increase of the throughput.

It is to be understood that the embodiments described herein are merely illustrative of the principles of the invention. Various modifications may be made thereto by persons skilled in the art without departing from the spirit and scope of the invention.

What is claimed is:

1. A device for a functional testing of integrated circuits and other electronic test pieces with a multiplicity of external terminals, comprising:
    (a) a plurality of substantially identical test heads, each head having a terminal field comprising a plurality of electrically conducting contacts to which a test piece can be connected and through which electrical signals can be applied and tested at the test piece external terminals connected thereto and having pin electronics circuitry enclosed therein for each terminal field contact;
    (b) a main computer, to which the plurality of substantially identical test heads are coupled, for coordinating the operation of the test heads by means of a common test program and for providing a respective portion of said test program for each test head; and
    (c) an adapter for connecting part of the external terminals of a test piece to a first test head, said test piece having a number of external terminals which exceeds the maximum number of contacts in the terminal field of the first test head, and for connecting the rest of the test piece external terminals to at least one further test head in mutual physical proximity to the first test head.

2. The testing device set forth in claim 1, wherein: the terminal field of each test head is arranged off-center of a top area of the test head and, in particular, at an edge of the top area so that the test heads which are in mutual physical proximity can be placed side by side having the respective terminal fields proximately side by side.

3. The testing device set forth in claim 1, wherein: the adapter comprises a plate, a plurality of terminals contacts on an underside of the plate arranged in at least two groups, each group having a same raster pitch as the terminal field of one of the test heads, a plug-in socket on a top side of the plate corresponding to a pattern formed by the external terminals of the test piece, and means for connecting the plate mechanically to the test heads, the terminal fields of the at least two test heads in mutual physical proximity being covered by the plate so that the terminal contacts of each group of terminal contacts can be connected electrically to the terminal field of one of the proximate test heads.

4. The testing device set forth in claim 2, wherein: the adapter comprises a plate, a plurality of terminal contacts on an underside of the plate arranged in at least two groups, each group having a same raster pitch as the terminal field of one of the test heads, a plug-in socket on a top side of the plate corresponding to a pattern formed by the external terminals of the test piece, and means for connecting the plate mechanically to the test heads, the terminal fields of the at least two test heads arranged side by side being covered by the plate so that the terminal contacts of each group of terminal contacts can be connected electrically to the terminal field of one of the test heads arranged proximately side by side.

5. The testing device set forth in claim 1, wherein: each of the at least two test heads in mutual physical proximity has a first opening for a cooling air stream located at a lateral surface which is facing away from the at least one other proximate test head and a second opening for the cooling air stream located in a bottom surface, the orientation of the cooling air streams of all the test heads being identical.

6. The testing device set forth in claim 2, wherein: each of the at least two test heads arranged side by side has a first opening for a cooling air stream located at a lateral surface which is facing away from the at least one other proximate test head and a second opening for the cooling air stream located in a bottom surface, the orientation of the cooling air streams of all the test heads being identical.

7. The testing device set forth in claim 3, wherein: each of the at least two test heads in mutual physical proximity has a first opening for a cooling air stream located at a lateral surface which is facing away from the at least one other proximate test head and a second opening for the cooling air stream located in a bottom surface, the orientation of the cooling air streams of all the test heads being identical.

8. The testing device set forth in claim 4, wherein: each of the at least two test heads arranged side by side has a first opening for a cooling air stream located at a lateral surface which is facing away from the at least one other proximate test head and a second opening for the cooling air stream located in a bottom surface, the orientation of the cooling air streams of all the test heads being identical.

9. A method of operating a computercontrolled testing device for a functional testing of integrated circuits and other electronic test pieces with a multiplicity of external terminals, having a plurality of substantially identical test heads each with a terminal field of electrically conductive contacts to which a test piece can be connected and through which electrical signals can be applied and tested at the test piece external terminals connected thereto and each having pin electronics circuitry enclosed therein for each terminal field contact, comprising the steps of:
    (a) bringing at least two of the test heads into mutual physical proximity;
    (b) connecting a part of the external terminals of a test piece to a first test head, said test piece having a number of external terminals exceeding the maximum number of contacts in the terminal field of the first test head, and connecting the rest of the test piece external terminals to at least one further proximate test head via an adapter;
    (c) loading, by a main computer, a respective portion of a common test program and respective data into each test head; and (d) synchronizing a testing cycle of all the proximate test heads via one test head thereof.

10. Apparatus for testing electronic devices having a multiplicity of external terminals, comprising:
 (a) a first test head having a housing; a plurality of electrically conducting contacts, arranged in a raster on a surface of the housing, to which the external terminals of an electronic device can be connected; and pin electronics circuitry for each contact, enclosed in the housing and connected to the respective contact, to control the application of test signals from the test head to the electronic device;
 (b) at least one second test head having a configuration substantially identical to the first test head and being in mutual physical proximity to the first test head;
 (c) an adapter for connecting part of the external terminals of the electronic device to the first test head, said electronic device having a number of external terminals which exceeds the number of contacts of the first test head, and for connecting the rest of the external terminals to the at least one second test head; and
 (d) a computer, to which the test heads are coupled, for coordinating the operation of the test heads by means of a single test program and for providing a respective portion of said test program for each test head.

* * * * *